(12) United States Patent  
Hwang et al.

(10) Patent No.: US 7,105,396 B2
(45) Date of Patent: Sep. 12, 2006

(54) PHASE CHANGEABLE MEMORY CELLS AND METHODS OF FABRICATING THE SAME

(75) Inventors: Young-nam Hwang, Gyeonggi-do (KR); Se-ho Lee, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 60 days.

(21) Appl. No.: 10/651,877

(22) Filed: Aug. 29, 2003

(65) Prior Publication Data
US 2004/0087074 A1    May 6, 2004

(30) Foreign Application Priority Data
Nov. 1, 2002    (KR) .................. 10-2002-0067350

(51) Int. Cl.
H01L 21/336    (2006.01)
H01L 21/8234    (2006.01)
H01L 47/00    (2006.01)
H01L 29/00    (2006.01)

(52) U.S. Cl. ............... 438/198; 438/238; 438/382; 257/4; 257/528; 257/536

(58) Field of Classification Search ............. 438/198, 438/238, 210, 95, 102, 382; 257/4, 536, 257/528
See application file for complete search history.

(56) References Cited

U.S. PATENT DOCUMENTS 3,401,318 A    9/1968    Jensen

| 6,605,527 | B1 * | 8/2003 | Dennison et al. ........... 438/618 |
| 6,764,894 | B1 * | 7/2004 | Lowrey ...................... 438/238 |
| 2001/0049189 | A1 | 12/2001 | Zahorik |
| 2002/0045323 | A1 | 4/2002 | Lowrey et al. |
| 2002/0081807 | A1 | 6/2002 | Xu |
| 2004/0012009 | A1 * | 1/2004 | Casagrande et al. ......... 257/4 |

FOREIGN PATENT DOCUMENTS

| DE | 39 27 033 A1 | 3/1990 |
| EP | 1 339 110 A1 | 8/2003 |
| KR | 2004-32955 | 4/2004 |

OTHER PUBLICATIONS

Notice of Office Action, Korean Application No. 10-2002-0067350, Aug. 25, 2004, 5 pages.
German Office Action for German Application No. 103 51 017.6-33 on Apr. 20, 2005.

* cited by examiner

Primary Examiner—Michael Trinh
(74) Attorney, Agent, or Firm—Myers Bigel Sibley & Sajovec, PA

(57) ABSTRACT

A phase changeable memory cell that includes a substrate, a bottom electrode, a phase changeable material layer pattern, and a top electrode. The bottom electrode is on the substrate. The phase changeable material layer pattern is on the bottom electrode. The top electrode is on the phase changeable material layer pattern, and has a tip that extends toward the bottom electrode.

24 Claims, 9 Drawing Sheets

PHASE CHANGEABLE MEMORY CELLS AND METHODS OF FABRICATING THE SAME

RELATED APPLICATION

This application claims the benefit of Korean Patent Application No. 10-2002-0067350, filed on Nov. 1, 2002, the disclosure of which is hereby incorporated herein by reference in its entirety.

BACKGROUND OF THE INVENTION

1. Field of the Invention

The present invention relates to nonvolatile memory devices and methods of fabricating the same and, more particularly, to phase changeable memory cells and fabrication methods thereof.

2. Description of Related Art

Nonvolatile memory devices can retain stored data after their power supply is interrupted. Some nonvolatile memory devices use flash memory cells with stacked gate structures. Flash memory cells can include a tunnel oxide layer, a floating gate, an inter-gate dielectric layer and a control gate electrode, which are sequentially stacked on a channel region. The reliability and the programming efficiency of flash memory cells can depend on the characteristics of the tunnel oxide layer and the coupling ratio of the cell.

A nonvolatile memory device that uses a phase changeable memory device instead of a flash memory device has been proposed. FIG. 1 illustrates an equivalent circuit of a phase changeable memory cell. Referring to FIG. 1, the phase changeable memory cell includes a single access transistor $T_A$ and a single variable resistor R, which are serially connected to each other. The variable resistor R serves as a data storage element, and includes a bottom electrode, a top electrode and a phase changeable material layer interposed therebetween. The top electrode of the variable resistor R is connected to a plate electrode PL. The access transistor $T_A$ includes a source region connected to the bottom electrode, a drain region spaced apart from the source region, and a gate electrode located over a channel region between the source and drain regions. The gate electrode and the drain region are electrically connected to a word line WL and a bit line BL, respectively. The equivalent circuit of the phase changeable memory cell is similar to that of a dynamic random access memory (DRAM) cell. However, the phase changeable memory cell is programmed in a much different fashion than a DRAM cell. For example, the phase changeable material layer transitions between two stable states based on temperature.

FIG. 2 is a graph that illustrates a property of the phase changeable material layer. In this graph, the abscissa represents time T and the ordinate represents temperature TMP of the phase changeable material layer.

Referring to FIG. 2, when the phase changeable material layer is heated to a temperature that is higher than its melting point Tm for a first time duration T1, and then cooled down rapidly, the phase changeable material layer is transformed into an amorphous state (refer to curve ①). In contrast, when the phase changeable material layer is heated to a temperature that is in a range between its crystallization temperature Tc and its melting temperature Tm for a second time duration T2 (longer than the first duration T1) and is then cooled down, the phase changeable material layer is transformed into a crystalline state (refer to curve ②). The resistivity of the phase changeable material layer in the amorphous state is higher than that of the phase changeable material layer in the crystalline state. Thus, information can be stored in the memory cell as a logic "1" or a logic "0" by setting the phase of the phase changeable material layer, and can be read by detecting the current that flows through the phase changeable material layer. A compound material layer containing germanium Ge, stibium Sb and tellurium Te (hereinafter, referred to a GST layer) can be used as the phase changeable material layer.

A method of fabricating the phase changeable memory device is described in U.S. Pat. No. 6,117,720 entitled "Method of making an integrated circuit electrode having a reduced contact area".

FIG. 3 is a cross sectional view illustrating a variable resistor 30 described in the U.S. Pat. No. 6,117,720.

Referring to FIG. 3, a bottom electrode 10 is disposed over a semiconductor substrate (not shown). An interlayer insulation layer 12 having an opening is stacked on the bottom electrode 10. A lower portion of the opening is filled with a plug 14 that is electrically connected to the bottom electrode 10. A sidewall of the opening and an edge of the plug 14 are covered with a spacer 16. The remaining space of the opening is filled with a contact portion 18, and the contact portion 18 is electrically connected to the plug 14.

The contact portion 18 may be a phase changeable material layer or a conductive layer. When the contact portion 18 is a phase changeable material layer, the interlayer insulation layer 12 and the contact portion 18 are covered with a top electrode 20. When the contact portion 18 is a conductive layer, the contact portion 18 is covered with a phase changeable material layer pattern and the phase changeable material layer pattern is covered with a top electrode.

FIGS. 4 and 5 are enlarged sectional views of the contact portion 18 shown in FIG. 3. FIG. 4 illustrates a contact portion 18a that includes a phase transformation region 22, and FIG. 5 illustrates a contact portion 18b that is a conductive layer, and that is covered by a phase changeable material layer pattern 20 having a phase transformation region 22.

SUMMARY OF THE INVENTION

Some embodiments of the present invention provide a phase changeable memory cell that includes a substrate, a bottom electrode, a phase changeable material layer pattern, and a top electrode. The bottom electrode is on the substrate. The phase changeable material layer pattern is on the bottom electrode. The top electrode is on the phase changeable material layer pattern, and has a tip that extends toward the bottom electrode.

In some further embodiments, the bottom electrode may be cylindrical, and may have a planar portion and a vertical portion that extends from an edge of the planar portion. The tip of the top electrode may extend toward the vertical portion of the bottom electrode. The phase changeable memory cell may further include a middle interlayer insulating layer on the bottom electrode, which may define a contact hole that exposes at least a part of the vertical portion of the bottom electrode. The phase changeable material layer pattern may be in the contact hole, and may also extend across a portion of the middle interlayer insulating layer.

Various other embodiments of the present invention provide other phase changeable memory cells and methods of fabricating phase changeable memory cells.

DETAILED DESCRIPTION OF THE INVENTION

Figure 1:
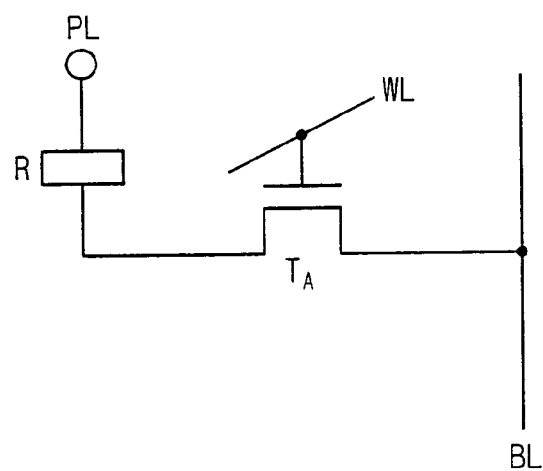
FIG. 1 is a circuit diagram equivalent representation of a phase changeable memory cell.
Figure 2:
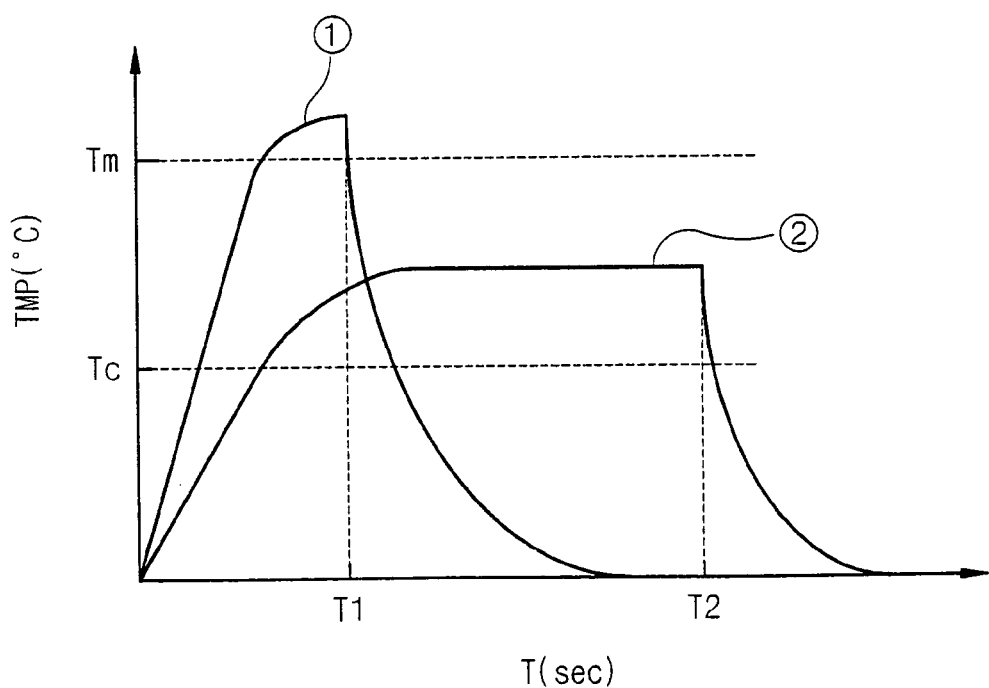
FIG. 2 is a graph that illustrates properties of a phase changeable material that may be used in a phase changeable memory cell.
Figure 3:
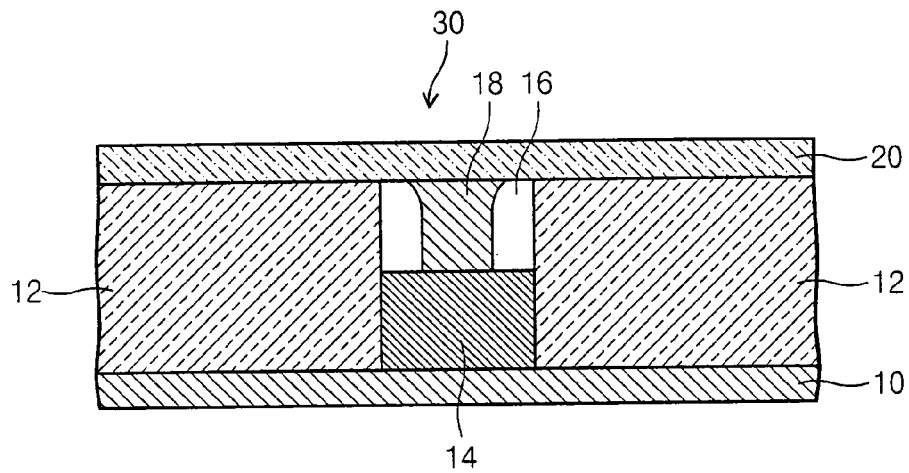
FIG. 3 is a cross sectional view of a portion of a prior art phase changeable memory cell.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when an element, such as a layer, region or substrate, is referred to as being "on" another element, it can be directly on the other element or intervening elements may also be present. In contrast, when an element, such as a layer, region or substrate, is referred to as being "directly on" another element, there are no intervening elements present.

Figure 4:
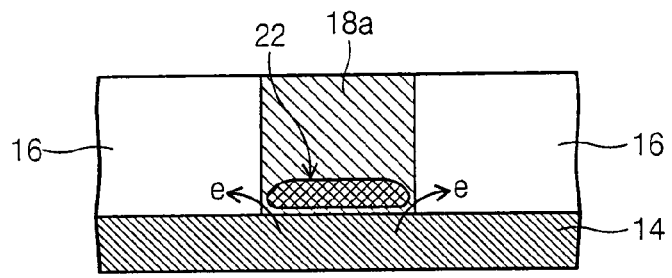
FIGS. 4 and 5 are enlarged cross sectional views of the prior art phase changeable memory cell shown in FIG. 3.

Referring to the phase changeable memory cell of FIG. 4, when current flows in the bottom electrode 10, heat is generated at an interface between the plug 14 and the contact portion 18a as well as in the bulk region of the contact portion 18a. The heating can result in a phase change in a phase transformation region 22 of the contact portion 18a. Temperature of an edge of the contact portion 18a, which is in contact with the plug 14, may be lower than temperature of the central region thereof because, for example, the heat conductivity of the plug 14 may be relatively high compared to the contact portion 18a, and the temperature of the spacer 16 may be lower than that of the contact portion 18a. Consequently, the edge of the contact portion 18a may not be fully transformed into the amorphous state and/or the crystalline state when the phase transformation region 22 undergoes a corresponding state transformation. If the edge of the contact portion 18a is not fully transformed into the amorphous state, leakage current may flow through the edge of the contact portion 18a in a read mode. Such leakage current may cause a malfunction or other undesired operational characteristic of the phase changeable memory cell.

Figure 5:
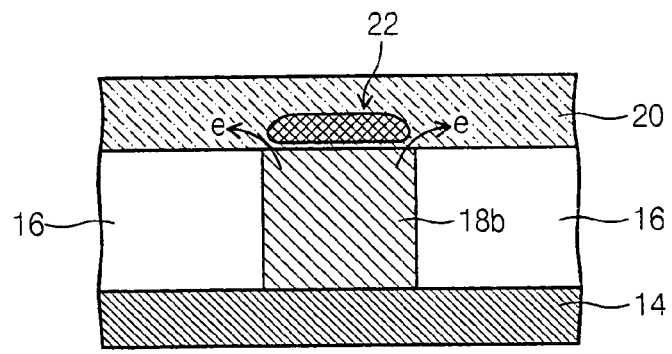

Referring to the phase changeable memory cell of FIG. 5, the contact portion 18b of a conductive layer is covered by the phase changeable material layer pattern 20, and the phase transformation region 22 is formed in the phase changeable material layer pattern 20. Because of, for example, uneven heating, the phase changeable material layer pattern 20 over the edge of the contact portion 18b may not be fully transformed into the amorphous state and/or the crystalline state when the phase transformation region 22 undergoes a corresponding state transformation. Accordingly, the phase changeable memory cell that is shown in FIG. 5 may malfunction or may be prone to other undesired operational characteristic as was described with regard to the phase changeable memory cell of FIG. 4. The phase changeable memory cell of FIGS. 4 and 5 may also exhibit low writing efficiency.

Figure 6A:
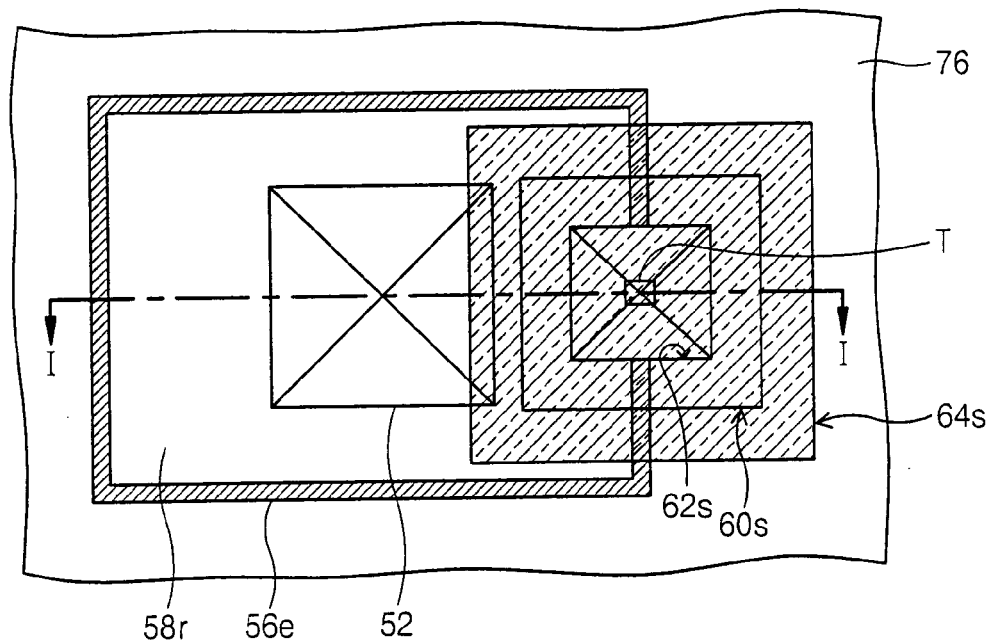
FIGS. 6A and 6B are a cross sectional view and a top view, respectively, illustrating a variable resistor of a phase changeable memory cell according to a first embodiment of the present invention.
Figure 6B:
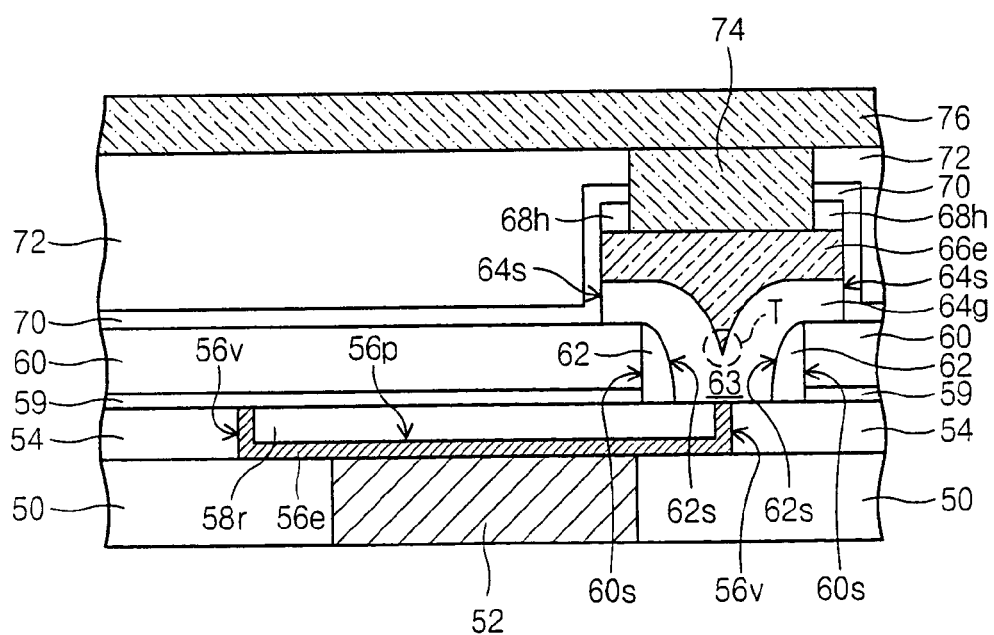

FIG. 6A is a top view of a variable resistor of a phase changeable memory cell according to a first embodiment of the present invention, and FIG. 6B is a cross sectional view taken along the line I—I of FIG. 6A.

Referring to FIGS. 6A and 6B, the phase changeable memory cell according to the first embodiment of the invention includes a cylindrical bottom electrode 56e formed over a semiconductor substrate (not shown). The bottom electrode 56e is on a lower interlayer insulating layer 50 that is on the semiconductor substrate. The bottom electrode 56e may be electrically connected to the semiconductor substrate through a contact plug 52 that penetrates the lower interlayer insulating layer 50. The bottom electrode 56e can include a planar portion 56p and a vertical portion 56v that extends from an edge of the planar portion 56p. The planar portion 56p may be directly on the contact plug 52. The bottom electrode 56e may be a titanium nitride (TiN) layer, a titanium aluminum nitride (TiAlN) layer, a titanium silicon nitride (TiSiN) layer, a tantalum aluminum nitride (TaAlN) layer and/or a tantalum silicon nitride (TaSiN) layer.

The bottom electrode 56e may be surrounded by an inner mold layer 58r and an outer mold layer 54. The inner mold layer 58r fills an inner space of the bottom electrode 56e. Accordingly, the vertical portion 56v is between the inner mold layer 58r and the outer mold layer 54, and an upper end of the vertical portion 56v may have a circular configuration when viewed from a top view.

The bottom electrode 56e and the mold layers 54 and 58r may be covered with another interlayer insulating layer 60. An etch stop layer 59 may be interposed between the interlayer insulating layers 54 and 60. A part of the vertical portion 56v is exposed by a contact hole that penetrates the interlayer insulating layer 60 and the etch stop layer 59. A sidewall 60s of the contact hole is covered with a spacer pattern 62. A sidewall 62s of the spacer pattern 62 defines a hollow region 63 in the contact hole. The hollow region 63 exposes part of the vertical portion 56v. The hollow region 63 may be covered with a phase changeable material layer pattern 64g and a top electrode 66e, which are sequentially stacked. The phase changeable material layer pattern 64g and the top electrode 66e may extend across a portion of the interlayer insulating layer 60. The phase changeable material layer pattern 64g is electrically connected to the vertical portion 56v of the bottom electrode 56e through the hollow region 63. The top electrode 66e has a tip T, that extends toward the bottom electrode 56e, and, more particularly, may extend toward the vertical portion 56v of the bottom electrode 56e. The top electrode 66e may be a titanium nitride (TiN) layer, a titanium aluminum nitride (TiAlN) layer, a titanium silicon nitride (TiSiN) layer, a tantalum aluminum nitride (TaAlN) layer and/or a tantalum silicon nitride (TaSiN) layer. A hard mask pattern 68h may be additionally stacked on the top electrode 66e. The substrate including the top electrode 66e is covered with an upper interlayer insulating layer 72. A shield layer 70 may be interposed between the upper interlayer insulating layer 72 and a sidewall 64s of the phase changeable material layer pattern 64g. The shield layer 70 may prevent characteristics of the phase changeable material layer pattern 64g from being degraded. The shield layer 70 may be a silicon oxynitride layer. A plate electrode 76 is disposed on the upper interlayer insulating layer 72. The plate electrode 76 is electrically connected to the top electrode 66e via a plug 74 that passes through the upper interlayer insulating layer 72, the shield layer 70 and the hard mask pattern 68h. Alternatively, the plate electrode 76 may be directly on the top electrode 66e.

Figure 7A:
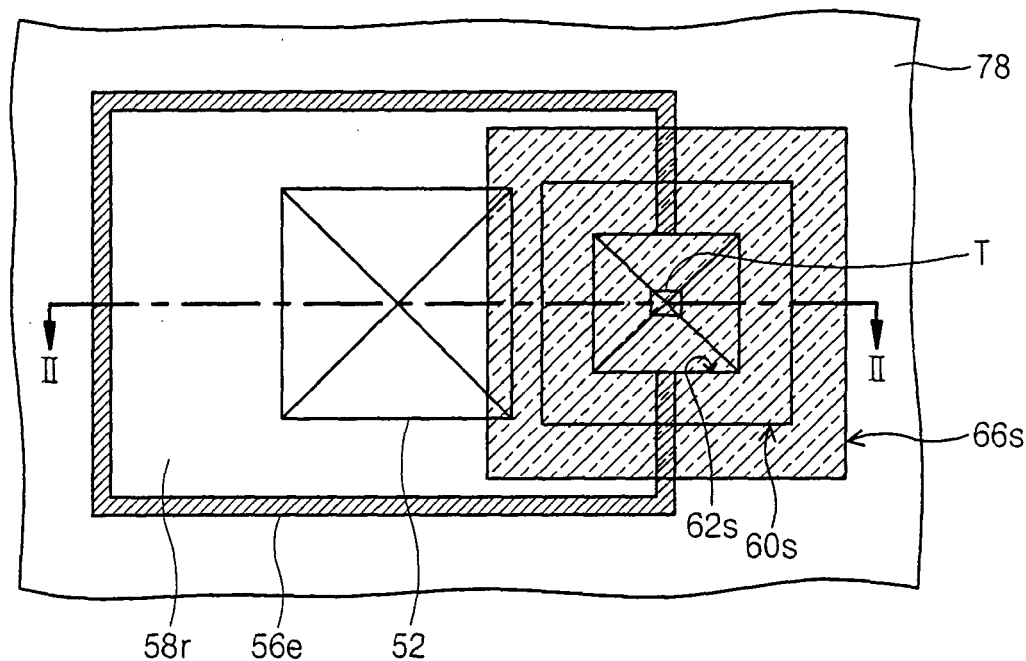
FIGS. 7A and 7B are a cross sectional view and a top view, respectively, illustrating a variable resistor of a phase changeable memory cell according to a second embodiment of the present invention.
Figure 7B:
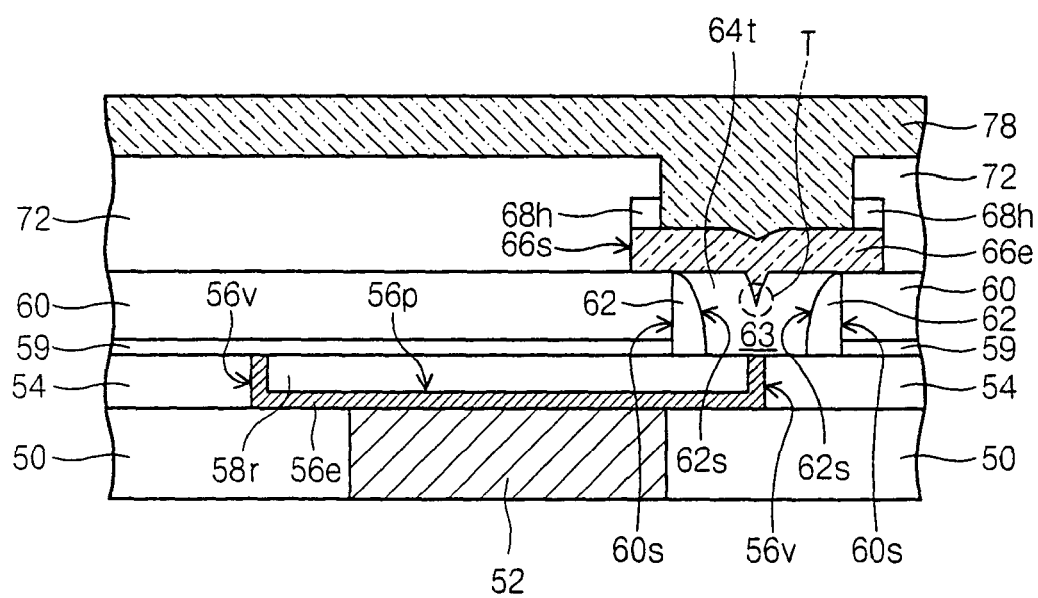

FIG. 7A is a top view illustrating a variable resistor of a phase changeable memory cell according to a second embodiment of the present invention, and FIG. 7B is a cross sectional view taken along the line II—II of FIG. 7A.

Referring to FIGS. 7A and 7B, a bottom electrode 56e, a spacer pattern 62 and a hollow region 63 can have the same configuration as those of the first embodiment described with regard to FIGS. 6A and 6B. The hollow region 63 surrounded by the spacer pattern 62 is filled with a phase changeable material layer pattern 64t. Thus, a sidewall of the phase changeable material layer pattern 64t is in contact with the spacer pattern 62. When the spacer pattern 62 is a silicon oxynitride layer, there may not be a need for an additional shield layer (70 of FIG. 6B). The phase changeable material layer pattern 64t may be covered with a top electrode 66e. The top electrode 66e is horizontally extended to cover the interlayer insulating layer 60. Accordingly, a sidewall 66s of the top electrode 66e is located on the interlayer insulating layer 60. The top electrode 66e also has a tip T, that extends toward the vertical portion 56v of the bottom electrode 56e. A hard mask pattern 68h and an upper interlayer insulating layer 72 are stacked on the substrate including the top electrode 66e, like the first embodiment. A plate electrode 78 is disposed on the upper interlayer insulating layer 72. The plate electrode 78 is electrically connected to the top electrode 66e through a contact hole that penetrates the upper interlayer insulating layer 72 and the hard mask pattern 68h.

FIGS. 8 to 12 are cross sectional views, taken along the line I—I of FIG. 6A, that illustrate methods of fabricating a phase changeable memory cell according to the first embodiment of the invention.

Figure 8:
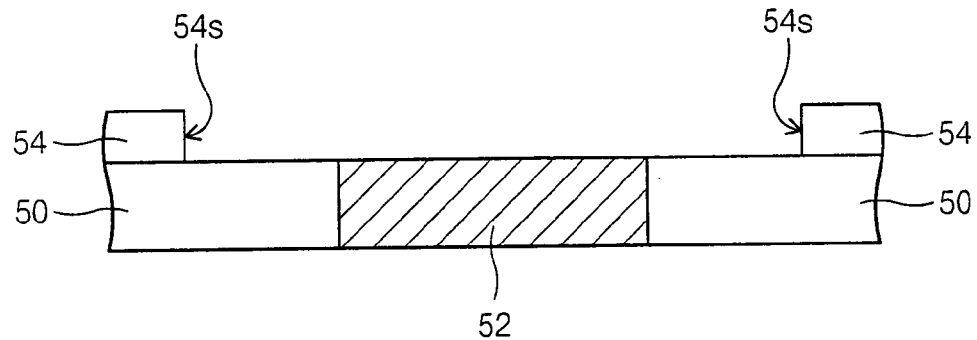
FIGS. 8 to 12 are cross sectional views that illustrate methods of fabricating a phase changeable memory cell according to the first embodiment of the present invention.

Referring to FIG. 8, a lower interlayer insulating layer 50 is formed on a semiconductor substrate (not shown). A contact plug 52 is formed in the lower interlayer insulating layer 50. The contact plug 52 is electrically connected to a predetermined region of the semiconductor substrate. For example, the predetermined region may be a source region of an access transistor. A first mold dielectric layer 54 is formed on the contact plug 52 and the lower interlayer insulating layer 50. The first mold dielectric layer 54 is patterned to form a bottom electrode hole having a sidewall 54s. The bottom electrode hole is formed to expose the contact plug 52.

Figure 9:
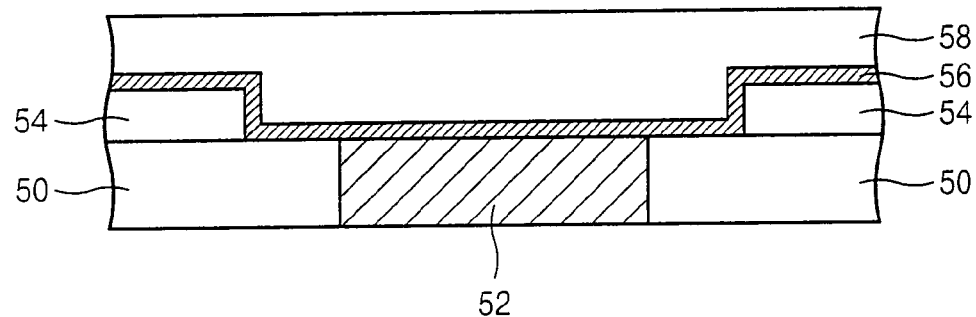

Referring to FIG. 9, a conformal conductive layer 56 is formed on the substrate having the bottom electrode hole. The conductive layer may be, for example, a titanium nitride (TiN) layer, a titanium aluminum nitride (TiAlN) layer, a titanium silicon nitride (TiSiN) layer, a tantalum aluminum nitride (TaAlN) layer and/or a tantalum silicon nitride (TaSiN) layer. A second mold dielectric layer 58 is then formed on the conductive layer 56.

Figure 10:
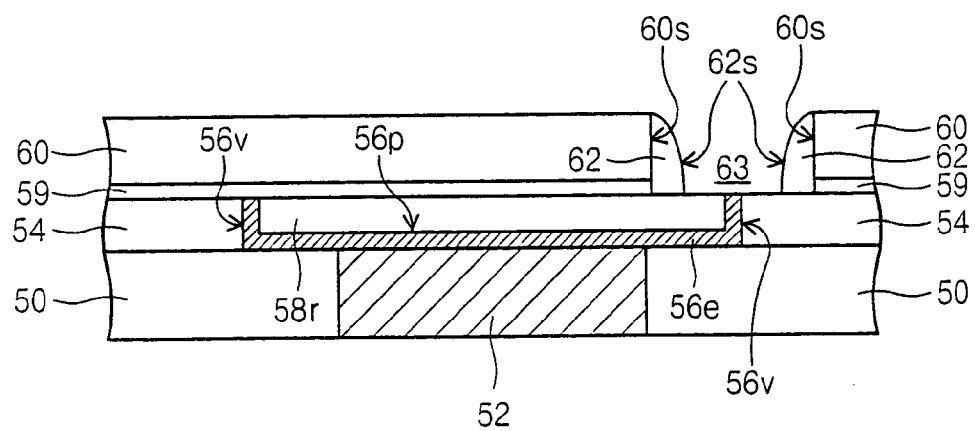

Referring to FIG. 10, the second mold dielectric layer 58 and the conductive layer 56 are planarized using, for example, a chemical mechanical polishing (CMP) technique until a top surface of the first mold dielectric layer 54 is exposed. As a result, a cylindrical bottom electrode 56e, which is electrically connected to the contact plug 52, is formed in the first mold dielectric layer 54. The bottom electrode 56e comprises a planar portion 56p connected to the contact plug 52 and a vertical portion 56v interposed between the mold dielectric layers 54 and 58r. The vertical portion 56v can have a circular shape when viewed from a top plan view. A middle interlayer insulating layer 60 is then formed on the substrate where the bottom electrode 56e is formed. An etch stop layer 59 may be formed on the substrate having the bottom electrode 56e prior to formation of the middle interlayer insulating layer 60. The middle interlayer insulating layer 60 is patterned to form a hole that exposes a part of the vertical portion 56v. The hole has a sidewall 60s. When the etch stop layer 59 is used, the hole may be formed by sequentially patterning the middle interlayer insulating layer 60 and the etch stop layer 59. In that case, the etch stop layer 59 may prevent the bottom electrode 56e from being over-etched while the middle interlayer insulating layer 60 is etched to form the hole.

Subsequently, a spacer insulating layer is conformably formed on the substrate including the hole. The spacer insulating layer may be anisotropically etched to form a spacer pattern 62 that covers the sidewall 60s of the hole. A sidewall 62s of the spacer pattern 62 defines a hollow region 63. The hollow region 63 exposes the vertical portion 56v.

Figure 11:
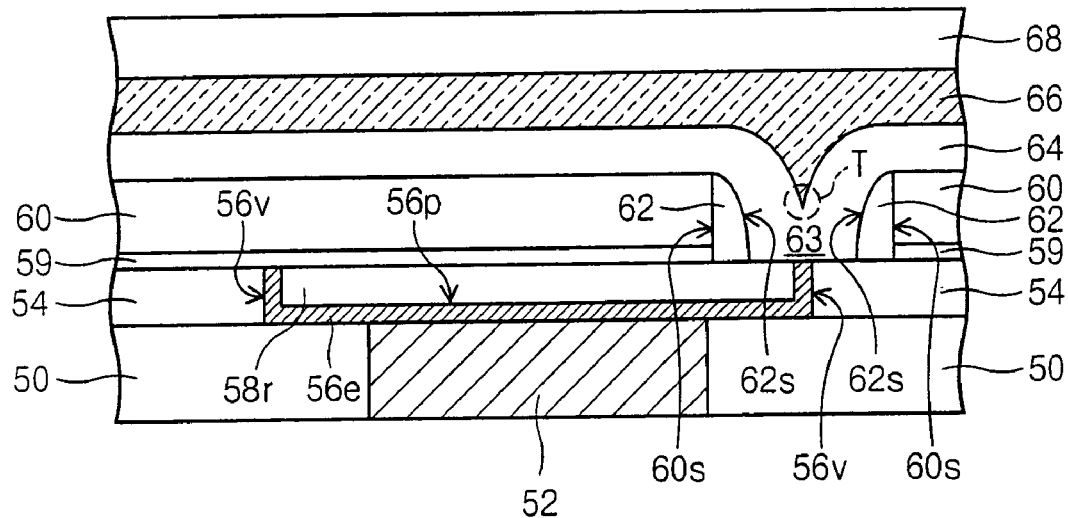

Referring to FIG. 11, a conformal phase changeable material layer 64 is formed on the substrate including the spacer pattern 62. The phase changeable material layer 64 may have an appropriate thickness to provide a dented portion in the hollow region 63. The dented portion of the phase changeable material layer 64 may extend toward the vertical portion 56v. A conductive layer 66 is then formed on the phase changeable material layer 64 including the dented portion. The conductive layer 66 thereby forms a tip T that fills the dented portion of the phase changeable material layer 64. The tip T may extend (e.g., protrude) toward the vertical portion 56v as shown in FIG. 11. The conductive layer 66 may be, for example, a titanium nitride (TiN) layer, a titanium aluminum nitride (TiAlN) layer, a titanium silicon nitride (TiSiN) layer, a tantalum aluminum nitride (TaAlN) layer and/or a tantalum silicon nitride (TaSiN) layer. A hard mask layer 68 may be additionally formed on the conductive layer 66.

Figure 12:
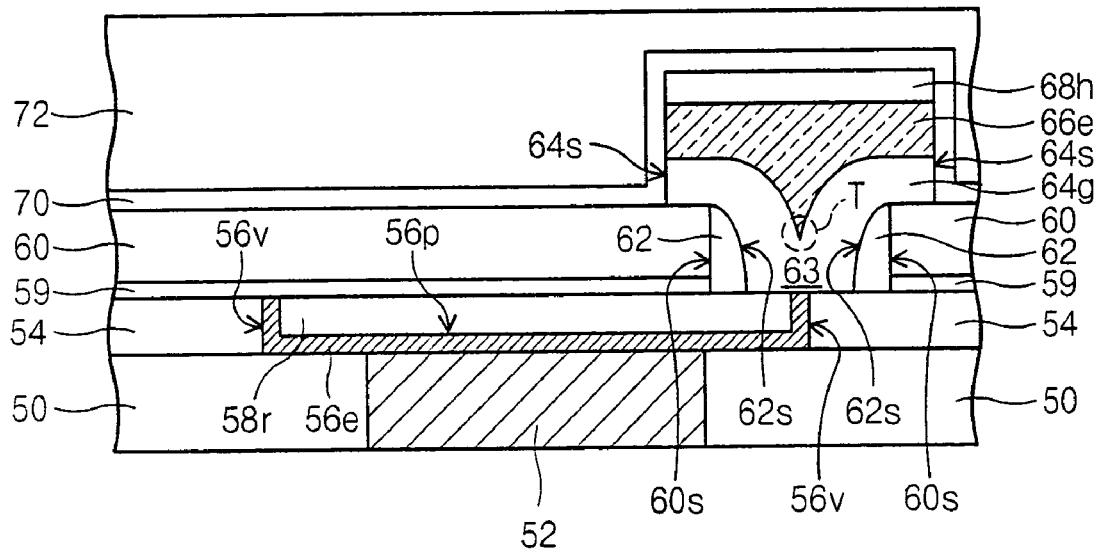

Referring to FIG. 12, the hard mask layer 68, the conductive layer 66 and the phase changeable material layer 64 are successively patterned to form a phase changeable material layer pattern 64g, a top electrode 66e and a hard mask pattern 68h, which are sequentially stacked over the hollow region 63. The phase changeable material layer pattern 64g is formed to have a sidewall 64s on the middle interlayer insulating layer 60. A shield layer 70 and an upper interlayer insulating layer 72 are sequentially formed on the substrate having the top electrode 66e and the phase changeable material layer pattern 64g. The shield layer 70 may serve as a protection layer that may prevent degradation of characteristics of the phase changeable material layer pattern 64g. The shield layer 70 may be formed of a silicon oxynitride (SiON) layer. The upper interlayer insulating layer 72 may be formed by sequentially stacking a high density plasma (HDP) oxide layer and a plasma enhanced tetra-ethyl-ortho-silicate (PETEOS) layer.

Subsequently, though not shown in FIG. 12, a plate electrode (76 of FIGS. 6A and 6B) may be formed on the upper interlayer insulating layer 72. The plate electrode 76 may be electrically connected to the top electrode 66e through a contact hole that penetrates the upper interlayer insulating layer 72, the shield layer 70 and the hard mask pattern 68h.

Figure 13:
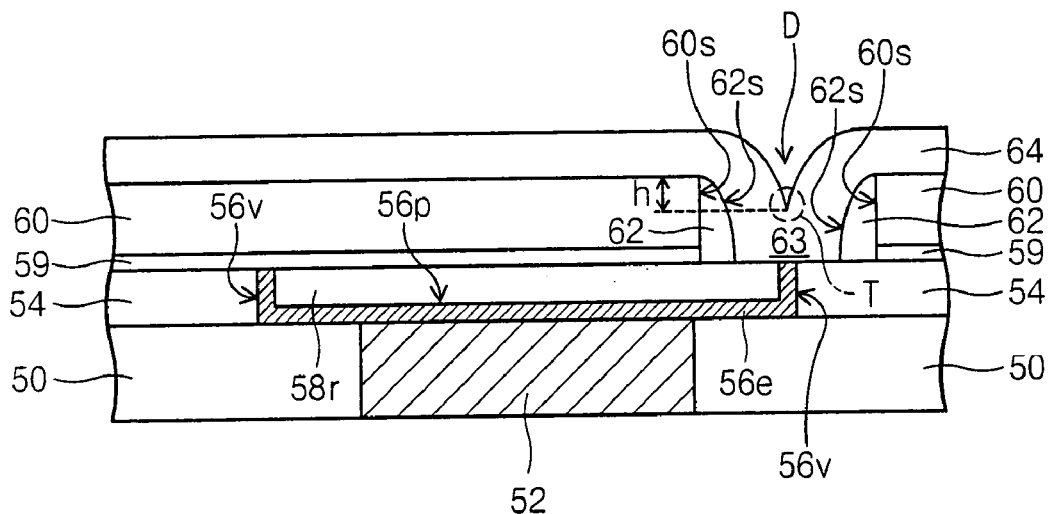
FIGS. 13 to 15 are cross sectional views that illustrate methods of fabricating a phase changeable memory cell according to the second embodiment of the present invention.
Figure 14:
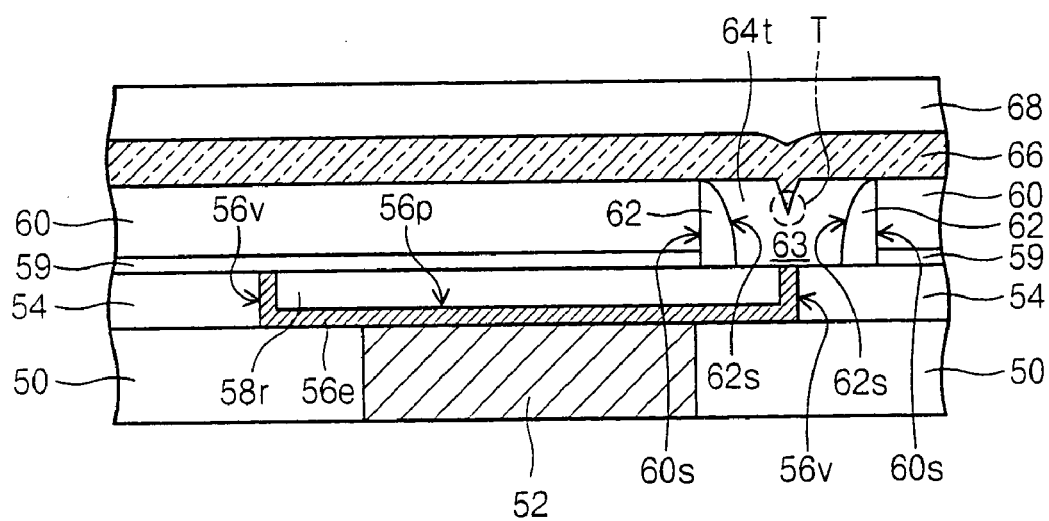
Figure 15:
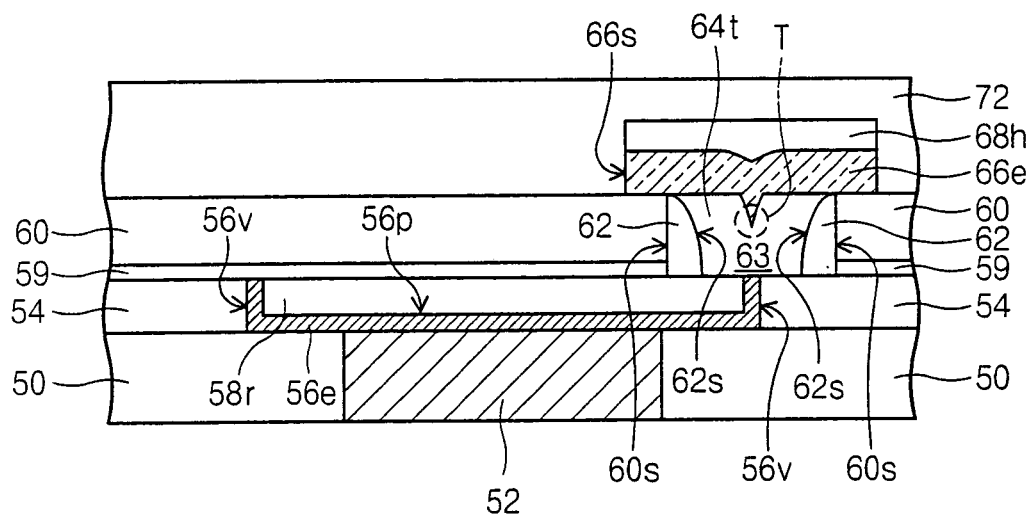

FIGS. 13 to 15 are cross sectional views that illustrate methods of fabricating a phase changeable memory cell according to the second embodiment of the invention.

Referring to FIG. 13, using the same manner as the first embodiment described with reference to FIGS. 8 to 11, the hollow region 63 and the phase changeable material layer 64 are formed over the semiconductor substrate. The phase changeable material layer 64 is formed to have a dented portion D as described in the first embodiment. In this embodiment, the phase changeable material layer 64 may be formed so that a lowest point of the dented portion D is lower than a top surface of the middle interlayer insulating layer 60. The lowest point of the dented portion D may be lower than the top surface of the middle interlayer insulating layer 60 by a predetermined height H as indicated in FIG. 13.

Referring to FIG. 14, the phase changeable material layer 64 is planarized using a chemical mechanical polishing technique until a top surface of the middle interlayer insulating layer 60. As a result, a phase changeable material layer pattern 64t is formed in the hollow region 63. The phase changeable material layer pattern 64t includes the dented portion D, and, as before, the lowest point of the dent D may be lower than the top surface of the middle interlayer insulating layer 60 as described above. A conductive layer 66 is formed on the phase changeable material layer pattern 64t including the dented portion D. Accordingly, the conductive layer 66 has a tip T that fills the dented portion D. The tip T extends (e.g., protrudes) toward the bottom electrode 56e, and may extend toward the vertical portion 56v of the bottom electrode 56e. In addition, the hard mask layer 68 may be formed on the conductive layer 66 as described in the first embodiment.

Referring to FIG. 15, the hard mask layer 68 and the conductive layer 66 are patterned to form a top electrode 66e and a hard mask pattern 64t, which are sequentially stacked over the phase changeable material layer pattern 64t. An upper interlayer insulating layer 72 is formed on the substrate having the top electrode 66e and the hard mask pattern 64t.

The plate electrode (78 of FIG. 7B) electrically connected to the top electrode 66e is formed on the upper interlayer insulating layer 72. In this embodiment, there may not be a need to form a shield layer (70 of FIG. 12), because the sidewall of the phase changeable material layer pattern 64t is surrounded by the spacer pattern 62.

Figure 16:
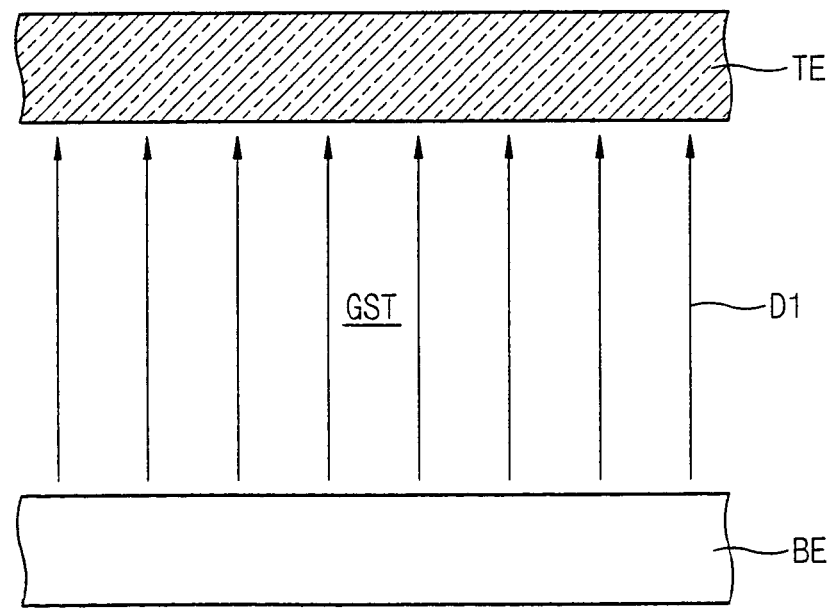
FIG. 16 is a schematic view illustrating current distribution in the phase changeable material layers of a prior art phase changeable memory cell.
Figure 17:
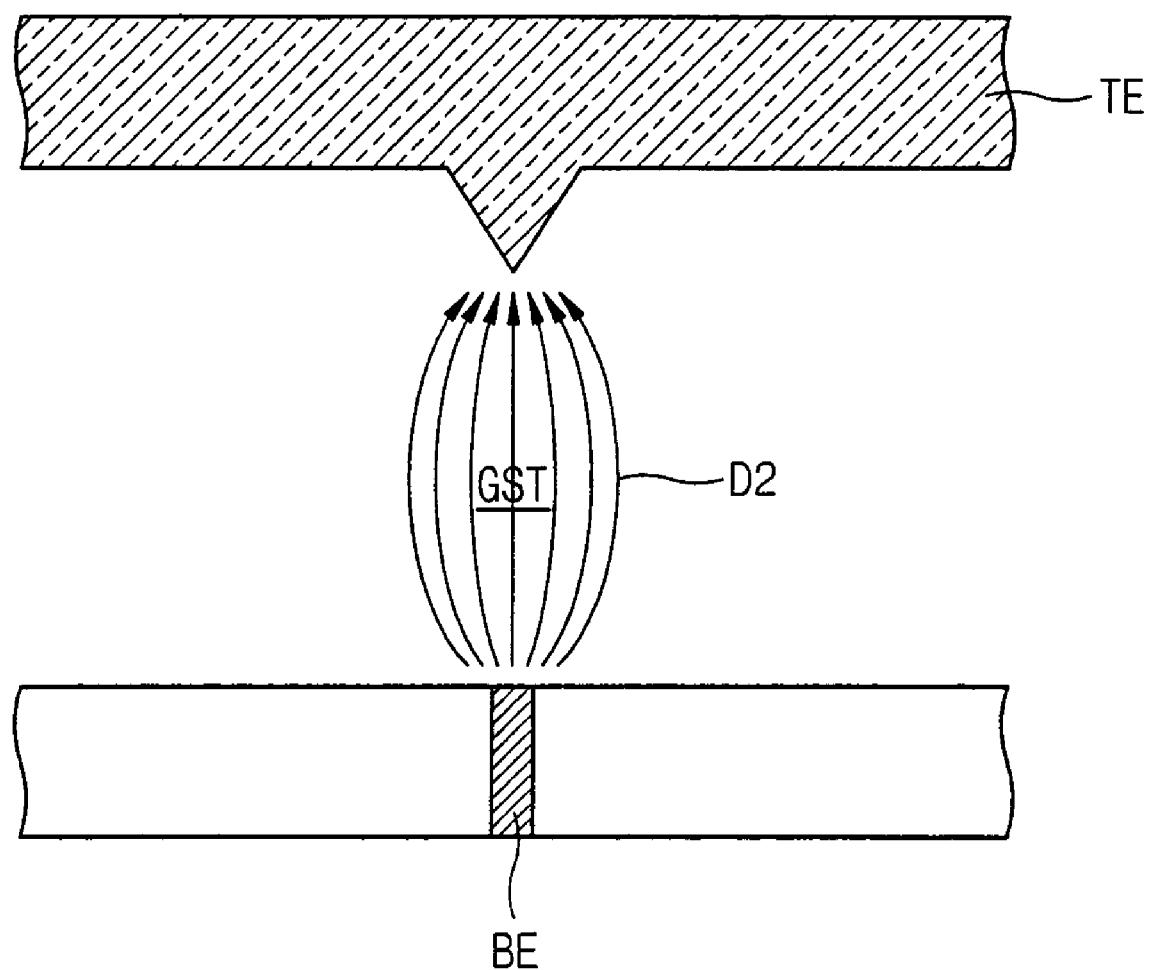
FIG. 17 is a schematic view illustrating current distribution in the phase changeable material layers of a phase changeable memory cell according to various embodiments of the present invention.

FIG. 16 is a current distribution diagram of a phase changeable material layer of a prior art phase changeable memory cell, and FIG. 17 is a current distribution diagram of a phase changeable material layer of a phase changeable memory cell according to various embodiments of the present invention.

As shown in FIG. 16, the prior art phase changeable memory cell has top and bottom electrodes TE and BE that are flat and parallel to each other. Accordingly, a current density D1 between the top and bottom electrodes TE and BE of the conventional phase changeable memory cell is uniform. Accordingly, the cell current may flow uniformly throughout a phase changeable material layer GST that is interposed between the top and bottom electrodes TE and BE.

In contrast, a phase changeable memory cell according to embodiments of the present invention comprises a top electrode TE having a tip, such as, for example, as shown in FIG. 17. The contact area between the bottom electrode BE and the phase changeable material layer GST may be less than the contact area between the top electrode TE and the phase changeable material layer GST. Consequently, the contact resistance between the bottom electrode BE and the phase changeable material layer GST may be higher than the contact resistance between the top electrode TE and the phase changeable material layer GST, and the current flowing through the phase changeable material layer GST may be concentrated toward the tip of the top electrode TE. Accordingly, embodiments of the present invention, as shown in FIG. 17, may exhibit a relatively high current density in the phase changeable material layer as compared to the prior art phase changeable memory cell, as shown in FIG. 16. As a result, efficient writing operations may be obtained without a need for increased current, and a low power phase changeable memory device may be thereby provided.

Many alterations and modifications may be made by those having ordinary skill in the art without departing from the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed is:

1. A phase changeable memory cell, comprising:
   a substrate;
   a bottom electrode on the substrate;
   a phase changeable material layer pattern on the bottom electrode; and
   a top electrode on the phase changeable material layer pattern, the top electrode having a tip that extends toward the bottom electrode, wherein the bottom electrode has a planar portion and a vertical portion, wherein the tip of the top electrode has a center along a length and width that is aligned with a center of a facing surface of the vertical portion of the bottom electrode, and wherein the tip of the top electrode forms a sharp point that is substantially more narrow than the facing surface of the vertical portion of the bottom electrode.

2. The phase changeable memory cell of claim 1, wherein the bottom electrode is cylindrical, and the vertical portion of the bottom electrode extends from an edge of the planar portion of the bottom electrode.

3. The phase changeable memory cell of claim 1, wherein the phase changeable material layer pattern is directly on the bottom electrode.

4. The phase changeable memory cell of claim 1, further comprising:
a lower interlayer insulating layer between the bottom electrode and the substrate; and
a contact plug extending through the lower interlayer insulating layer and electrically connecting the substrate with the bottom electrode.

5. The phase changeable memory cell of claim 1, wherein a center of the top electrode is aligned with the center of the facing surface of the vertical portion of the bottom electrode.

6. A phase changeable memory cell, comprising:
a substrate;
a bottom electrode on the substrate, the bottom electrode having a planar portion and a vertical portion;
a middle interlayer insulating layer on the substrate and the bottom electrode, the middle interlayer insulating layer defining a contact hole that exposes at least a part of the vertical portion of the bottom electrode;
a phase changeable material layer pattern in the contact hole, the phase changeable material layer pattern having a sidewall portion that extends out of the contact hole and across a portion of the middle interlayer insulating layer; and
a top electrode on the phase changeable material layer pattern, the top electrode having a tip that extends toward the vertical portion of the bottom electrode, wherein the tip of the top electrode has a center along a length and width that is aligned with a center of a facing surface of the vertical portion of the bottom electrode, and wherein the tip of the top electrode forms a sharp point that is substantially more narrow than the facing surface of the vertical portion of the bottom electrode.

7. The phase changeable memory cell of claim 6, further comprising a spacer pattern between a sidewall of the contact hole and the phase changeable material layer pattern in the contact hole.

8. The phase changeable memory cell of claim 6, wherein the bottom electrode is cylindrical, and the vertical portion of the bottom electrode extends from an edge of the planar portion of the bottom electrode, and further comprising a mold layer on the planar portion of the bottom electrode and adjacent to the vertical portion of the bottom electrode, and wherein the middle interlayer insulating layer covers the mold layer, and the contact hole exposes the mold layer adjacent to the exposed vertical portion of the bottom electrode.

9. The phase changeable memory cell of claim 6, further comprising:
a lower interlayer insulating layer between the bottom electrode and the substrate; and
a contact plug extending through the lower interlayer insulating layer to electrically connect the bottom electrode with the substrate.

10. The phase changeable memory cell of claim 6, further comprising an etch stop layer between the bottom electrode and the middle interlayer insulating layer.

11. The phase changeable memory cell of claim 6, further comprising a shield layer that covers a sidewall of the phase changeable material layer pattern.

12. The phase changeable memory cell of claim 6, further comprising a plate electrode on the top electrode, wherein the plate electrode is electrically connected to the top electrode.

13. The phase changeable memory cell of claim 6, wherein a center of the top electrode is aligned with the center of the facing surface of the vertical portion of the bottom electrode.

14. A phase changeable memory cell, comprising:
a substrate; a bottom electrode on the substrate, the bottom electrode having a planar portion and a vertical portion;
a middle interlayer insulating layer on the substrate and the bottom electrode, the middle interlayer insulating layer defining a contact hole that exposes at least a part of the vertical portion of the bottom electrode;
a phase changeable material layer pattern in the contact hole; and
a top electrode on the phase changeable material layer pattern, the top electrode having a tip that extends toward the vertical portion of the bottom electrode, wherein the tip of the top electrode has a center along a length and width that is aligned with a center of a facing surface of the vertical portion of the bottom electrode, and wherein the tip of the top electrode forms a sharp point that is substantially more narrow than the facing surface of the vertical portion of the bottom electrode.

15. The phase changeable memory cell of claim 14, further comprising a spacer pattern between a sidewall of the contact hole and the phase changeable material layer pattern in the contact hole.

16. The phase changeable memory cell of claim 14, wherein the phase changeable material layer pattern is directly on the vertical portion of the bottom electrode.

17. The phase changeable memory cell of claim 14, wherein the vertical portion of the bottom electrode extends from an edge of the planar portion of the bottom electrode, and further comprising a mold layer on the planar portion of the bottom electrode and adjacent to the vertical portion of the bottom electrode, and wherein the middle interlayer insulating layer covers the mold layer and the contact hole exposes the mold layer adjacent to the exposed vertical portion of the bottom electrode.

18. The phase changeable memory cell of claim 14, further comprising:
a lower interlayer insulating layer between the bottom electrode and the substrate; and
a contact plug extending through the lower interlayer insulating layer to electrically connect the bottom electrode with the substrate.

19. The phase changeable memory cell of claim 14, further comprising an etch stop layer between the bottom electrode and the middle interlayer insulating layer.

20. The phase changeable memory cell of claim 14 further comprising a plate electrode on the top electrode, wherein the plate electrode is electrically connected to the top electrode.

21. The phase changeable memory cell of claim 14, wherein a center of the top electrode is aligned with the center of the facing surface of the vertical portion of the bottom electrode.

22. A method of fabricating a phase changeable memory cell, the method comprising:
providing a substrate;
forming a bottom electrode on the substrate;
forming a phase changeable material layer on the bottom electrode; and
forming a top electrode on the phase changeable material layer, the top electrode having a tip that extends toward the bottom electrode, wherein forming a bottom electrode comprises forming the bottom electrode with a planar portion and a vertical portion, wherein forming a top electrode comprises forming the top electrode so that the tip extends toward the vertical portion of the bottom electrode and has a center along a length and width that is aligned with a center of a facing surface of the vertical portion of the bottom electrode, and wherein forming a top electrode comprises forming the top electrode so that the tip of the top electrode forms a sharp point that is substantially more narrow than the facing surface of the vertical portion of the bottom electrode.

23. The method of claim 22, further comprising:

forming a middle interlayer insulating layer on the bottom electrode, wherein the middle interlayer insulating layer defines a contact hole that exposes a part of the vertical portion of the bottom electrode, and wherein forming a phase changeable material layer on the bottom electrode comprises forming the phase change material layer in the contact hole and having a dented portion that extends toward the vertical portion of the bottom electrode, and wherein forming a top electrode on the phase changeable material layer comprises forming a conductive layer on the phase changeable material layer including in the dented portion of the phase changeable material layer.

24. The method of claim 22, wherein forming a top electrode comprising forming the top electrode so that its center is aligned with the center of the facing surface of the vertical portion of the bottom electrode.

* * * * *